United States Patent
Li

(10) Patent No.: US 11,502,225 B2
(45) Date of Patent: Nov. 15, 2022

(54) LIGHT-EMITTING DEVICE AND LIGHT-EMITTING DEVICE STRUCTURE

(71) Applicant: PlayNitride Display Co., Ltd., MiaoLi County (TW)

(72) Inventor: Yu-Chu Li, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 316 days.

(21) Appl. No.: 16/658,126

(22) Filed: Oct. 20, 2019

(65) Prior Publication Data

US 2021/0050481 A1 Feb. 18, 2021

(30) Foreign Application Priority Data

Aug. 14, 2019 (TW) .................................. 108128875

(51) Int. Cl.
*H01L 33/36* (2010.01)
*H01L 33/02* (2010.01)

(52) U.S. Cl.
CPC .............. *H01L 33/36* (2013.01); *H01L 33/02* (2013.01)

(58) Field of Classification Search
CPC ...................................................... H01L 33/02
See application file for complete search history.

(56) References Cited

U.S. PATENT DOCUMENTS

2016/0056352 A1* 2/2016 Koike ..................... H01L 33/22
257/98

FOREIGN PATENT DOCUMENTS

| CN | 102487111 | 6/2012 |
|---|---|---|
| CN | 103503172 | 1/2014 |
| JP | 2002033512 | 1/2002 |
| TW | 201419570 | 5/2014 |
| TW | 201511352 | 3/2015 |
| TW | 201624777 | 7/2016 |
| WO | 2011105557 | 9/2011 |

OTHER PUBLICATIONS

"Office Action of Taiwan Counterpart Application," dated Nov. 12, 2019, p. 1-p. 4.
"Office Action of China Counterpart Application", dated Apr. 27, 2020, p. 1-p. 7.

\* cited by examiner

*Primary Examiner* — Trang Q Tran
(74) *Attorney, Agent, or Firm* — JCIPRNET

(57) ABSTRACT

A light-emitting device includes an epitaxial structure, and first and second electrodes. The epitaxial structure has a first surface and a second surface opposite to each other, first dislocation density regions and second dislocation density regions. The first dislocation density regions and the second dislocation density regions are alternately disposed between the first surface and the second surface. A dislocation density of each first dislocation density region is lower than a dislocation density of each second dislocation density region and a quantity of the first dislocation density regions is at least ten. The epitaxial structure further includes a light-emitting layer, a first-type semiconductor layer and a second-type semiconductor layer disposed on two opposite sides of the light-emitting layer. The first electrode and the second electrode are electrically connected to the first-type semiconductor layer and the second-type semiconductor layer, respectively. A light-emitting device structure adopting the light-emitting device is provided.

9 Claims, 7 Drawing Sheets

LIGHT-EMITTING DEVICE AND LIGHT-EMITTING DEVICE STRUCTURE

CROSS-REFERENCE TO RELATED APPLICATION

This application claims the priority benefit of Taiwan application serial no. 108128875, filed on Aug. 14, 2019. The entirety of the above-mentioned patent application is hereby incorporated by reference herein and made a part of this specification.

BACKGROUND

Technical Field

The disclosure relates to a light-emitting device and a light-emitting device structure, and particularly relates to a light-emitting device with an epitaxial structure and a light-emitting device structure.

Description of Related Art

In recent years, under the circumstance that manufacturing cost of an Organic Light-Emitting Diode (OLED) display panel is too high and its service life cannot match a current mainstream display panel, micro LED displays gradually attract an investment attention of large science and technology factories. In addition to advantages of low energy consumption and long material service life, the micro LED display also has an excellent optical performance, such as high color saturation, fast response speed and high contrast.

However, during a manufacturing process of micro LEDs, since a lattice constant of an epitaxial material (for example, gallium nitride) does not match a lattice constant of a substrate (for example, a sapphire substrate) for crystal growth, a threading dislocation is easily formed in an epitaxial structure layer, and a distribution position of such dislocation is random. Therefore, when such type of the epitaxial structure layer is applied to a plurality of micro light-emitting devices, uneven distribution of the dislocation thereof is easy to cause different light-emitting wavelengths of the micro light-emitting devices, resulting in uneven display color of a display device of the micro light-emitting devices.

SUMMARY

The disclosure is directed to a light-emitting device structure, which has a uniform display color.

The disclosure is directed to a light-emitting device, which has a good light output uniformity.

The disclosure is directed to a light-emitting device, where a dislocation distribution of an epitaxial structure thereof is regular and even.

The disclosure provides a light-emitting device structure including a patterned substrate, an epitaxial structure, a first electrode and a second electrode. The patterned substrate includes a substrate and a plurality of patterns. The patterns and the substrate are formed integrally, and the patterns are separately disposed on the substrate from each other. The epitaxial structure is disposed on the patterned substrate and has a plurality of first dislocation density regions and a plurality of second dislocation density regions. The first dislocation density regions respectively correspond to the patterns. A dislocation density of each of the first dislocation density regions is lower than a dislocation density of each of the second dislocation density regions, and a quantity of the first dislocation density regions is at least ten. The epitaxial structure further includes a light-emitting layer, a first type semiconductor layer and a second type semiconductor layer disposed at two opposite sides of the light-emitting layer. The first electrode and the second electrode are electrically connected to the first type semiconductor layer and the second type semiconductor layer, respectively.

In an embodiment of the disclosure, a ratio between the dislocation density of any second dislocation density region and the dislocation density of any first dislocation density region of the light-emitting device structure is greater than or equal to 10.

In an embodiment of the disclosure, the patterns of the light-emitting device structure respectively have a bottom width and a height, and a ratio of the height and the bottom width is between 0.2 and 0.9

In an embodiment of the disclosure, a space exists between any two adjacent patterns of the light-emitting device structure, and the space is smaller than or equal to 0.5 μm.

In an embodiment of the disclosure, the light-emitting layer of the light-emitting device structure includes a plurality of first portions and a plurality of second portions. The first portions are located at the plurality of first dislocation density regions, and the second portions are located at the plurality of second dislocation density regions. The first portions respectively have a first thickness, the second portions respectively have a second thickness, and the first thickness is greater than the second thickness.

In an embodiment of the disclosure, each of the patterns of the light-emitting device structure is a protrusion structure.

In an embodiment of the disclosure, the first portions of the light-emitting device structure respectively have a first doped concentration, the second portions respectively have a second doped concentration, and the first doped concentration is higher than the second doped concentration.

In an embodiment of the disclosure, a quantity of the first dislocation density regions disposed on the epitaxial structure of the light-emitting device structure in a direction is at least ten.

In an embodiment of the disclosure, at least a part of the first dislocation density regions and at least a part of the second dislocation density regions of the light-emitting device structure are disposed on the patterned substrate in alternation along the direction.

In an embodiment of the disclosure, a quantity of threading dislocations of the first dislocation density region of the light-emitting device structure is one or more, and a quantity of threading dislocations of the second dislocation density region is two or more.

In an embodiment, a pitch exists between any two adjacent patterns of the light-emitting device structure, and the pitch is greater than 500 nm and smaller than or equal to 2500 nm.

The disclosure provides a light-emitting device including an epitaxial structure, a plurality of patterns, a first electrode and a second electrode. The epitaxial structure has a first surface and a second surface opposite to each other, a plurality of first dislocation density regions and a plurality of second dislocation density regions. The patterns and the epitaxial structure are formed integrally and separately disposed on the first surface from each other. The first dislocation density regions respectively correspond to the patterns. A dislocation density of each of the first dislocation density regions is lower than a dislocation density of each of the second dislocation density regions and a quantity of the first dislocation density regions is at least ten. The epitaxial structure further includes a light-emitting layer, a first type semiconductor layer and a second type semiconductor layer disposed at two opposite sides of the light-emitting layer. The first electrode and the second electrode are electrically connected to the first type semiconductor layer and the second type semiconductor layer, respectively.

In an embodiment of the disclosure, the first electrode and the second electrode of the light-emitting device are electrically connected to the epitaxial structure through the first surface and the second surface, respectively, and an upper surface of the first electrode is conformal to the first surface of the epitaxial structure.

In an embodiment of the disclosure, a roughness of the first surface of the epitaxial structure of the light-emitting device is greater than a roughness of the second surface of the epitaxial structure.

In an embodiment of the disclosure, each of the patterns of the light-emitting device is a recessed structure.

The disclosure provides a light-emitting device including an epitaxial structure, a first electrode and a second electrode. The epitaxial structure has a first surface and a second surface opposite to each other, a plurality of first dislocation density regions and a plurality of second dislocation density regions. The first dislocation density regions and the second dislocation density regions are disposed between the first surface and the second surface in alternation along a direction. A dislocation density of each of the first dislocation density regions is lower than a dislocation density of each of the second dislocation density regions, and a quantity of the first dislocation density regions is at least ten. The epitaxial structure further includes a light-emitting layer, a first type semiconductor layer and a second type semiconductor layer disposed at two opposite sides of the light-emitting layer. The first electrode and the second electrode are electrically connected to the first type semiconductor layer and the second type semiconductor layer, respectively.

Based on the above description, in the light-emitting device and the light-emitting device structure of an embodiment of the disclosure, the epitaxial structure has a plurality of first dislocation density regions and a plurality of second dislocation density regions disposed in alternation, and the dislocation density of each of the first dislocation density regions is lower than the dislocation density of each of the second dislocation density regions. By setting the quantity of the first dislocation density regions to be at least ten, the dislocation distribution of the epitaxial structure is regular and even, so as to improve light output uniformity of the light-emitting device and color uniformity of the light-emitting device structure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
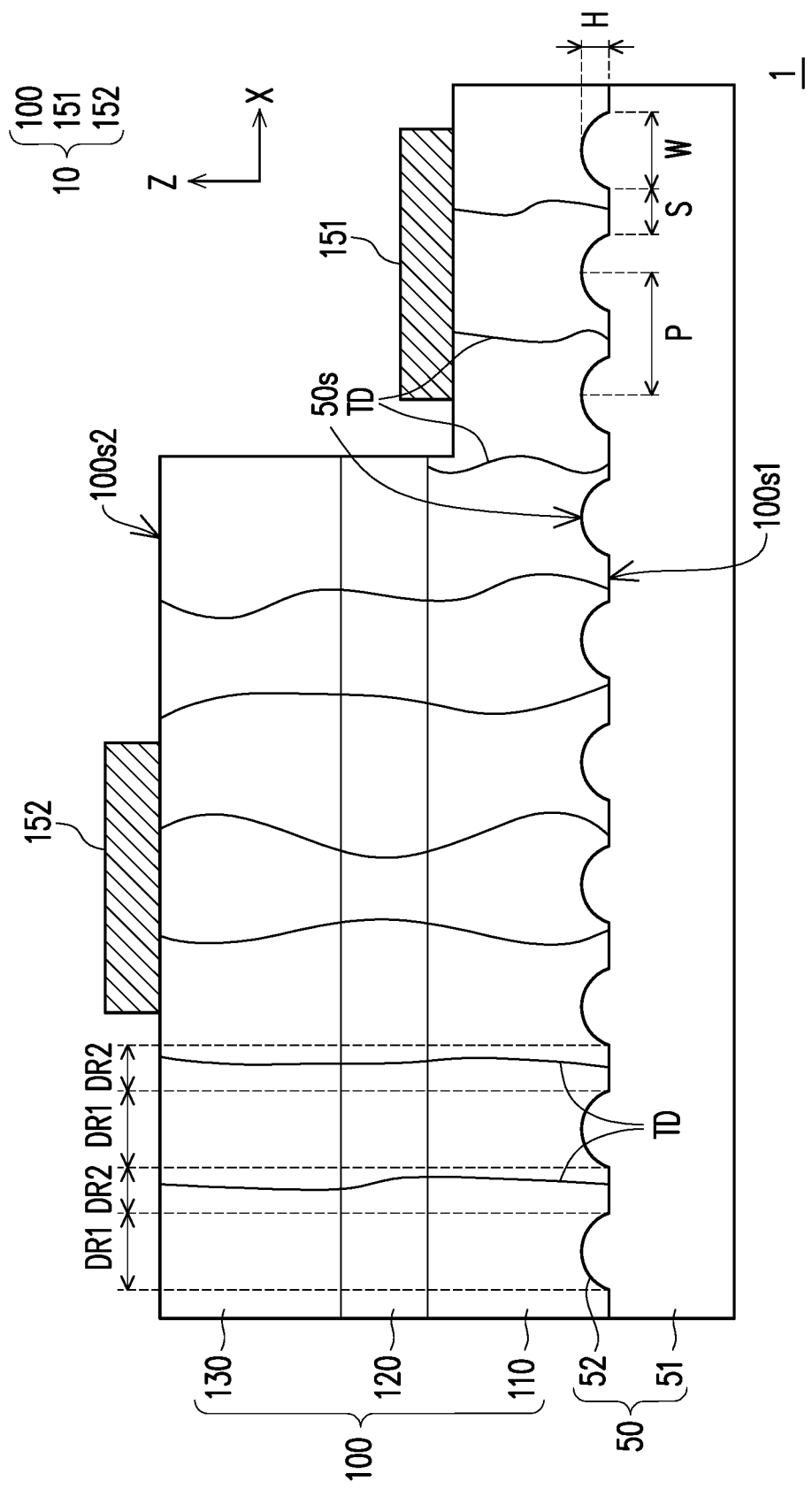
FIG. 1 is a cross-sectional view of a light-emitting device structure according to an embodiment of the disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
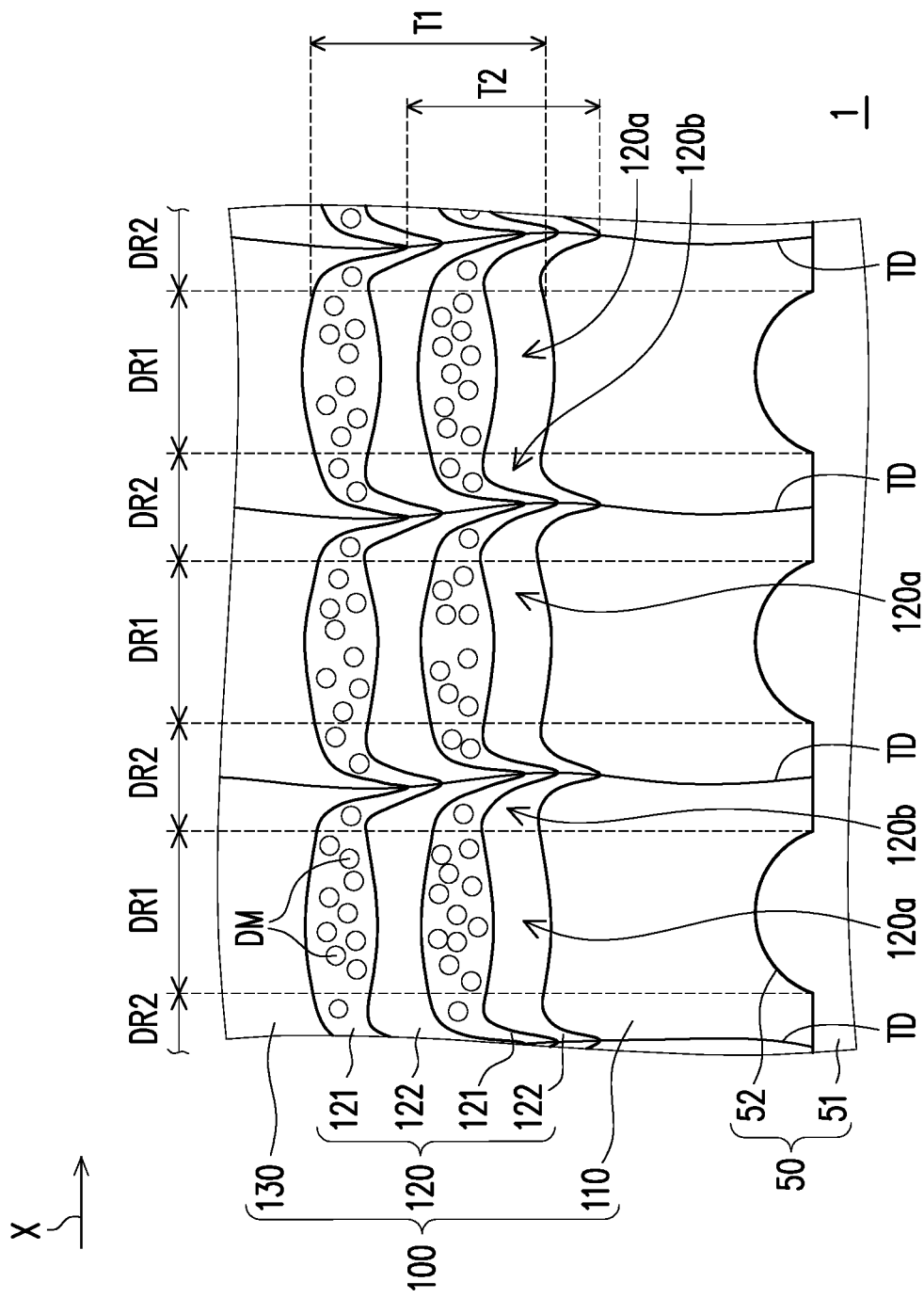
FIG. 2 is an enlarged view of a partial region of the light-emitting device structure of FIG. 1.
Figure 3:
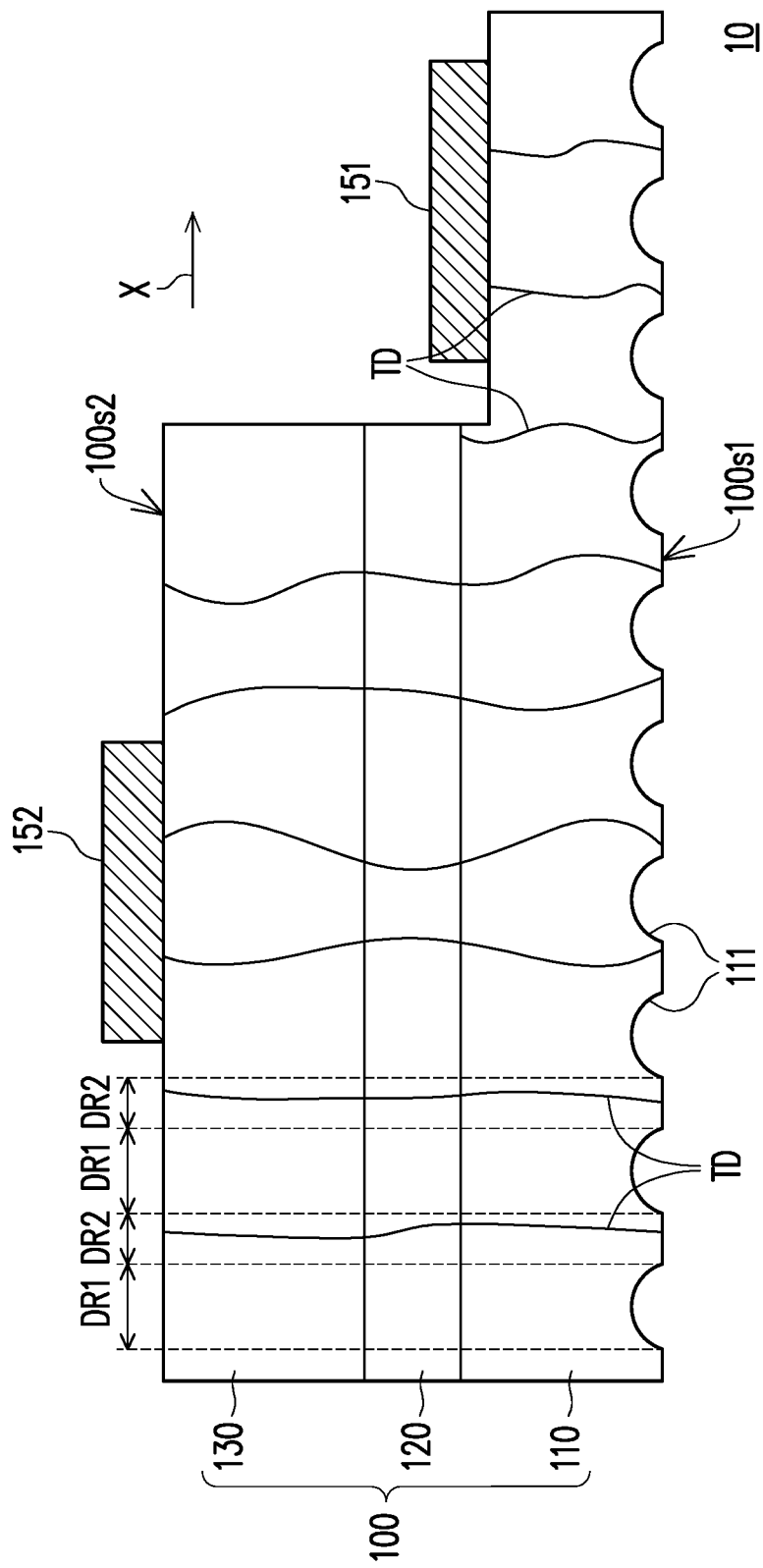
FIG. 3 is a cross-sectional view of a light-emitting device of FIG. 1.

FIG. 1 is a cross-sectional view of a light-emitting device structure according to an embodiment of the disclosure. FIG. 2 is an enlarged view of a partial region of the light-emitting device structure of FIG. 1. FIG. 3 is a cross-sectional view of a light-emitting device of FIG. 1. It should be noted that for clarity's sake, FIG. 1 does not illustrate well layers 121, barrier layers 122 and a doped metal DM shown in FIG. 2. Referring to FIG. 1, the light-emitting device structure 1 includes a patterned substrate 50 and an epitaxial structure 100. The epitaxial structure 100 is disposed on the patterned substrate 50. In detail, the patterned substrate 50 includes a substrate 51 and a plurality of patterns 52, and the patterns 52 are disposed on the substrate 51 along a direction X. In the embodiment, the substrate 51 is a substrate adapted for epitaxial growth, for example, a sapphire substrate, a silicon wafer substrate, a silicon carbide substrate or a polymer substrate, but the disclosure is not limited thereto.

Further, the patterns 52 and the substrate 51 are formed integrally. Namely, the patterns 52 and the substrate 51 are made of a same material and are seamlessly connected. For example, the patterns 52 are arc-shaped convex structures protruding from the substrate 51, which makes it easy to produce a plurality of first dislocation density regions DR1 corresponding to the convex structures in a subsequent epitaxial manufacturing process, but the disclosure is not limited thereto. In the embodiment, the pattern 52 respectively has a bottom width W and a height H in the direction X and a direction Z, and the bottom width W of the pattern 52 may be selectively greater than the height H of the pattern 52, but the disclosure is not limited thereto. In other embodiment, the bottom width W of the pattern 52 may also be smaller than the height H of the pattern 52.

In an exemplary embodiment, the bottom width W of the pattern 52 may be between 0.1 μm and 2.5 μm, and the height H may be between 10 nm and 1500 nm, which avails improving a light output efficiency of the epitaxial structure 100. In another exemplary embodiment, a ratio between the height H and the bottom width W of the pattern 52 may be between 0.2 and 0.9. When the ratio between the height H and the bottom width W is greater than 0.9, the epitaxial structure subsequently formed on the patterned substrate 50 has excessive dislocations to result in a decrease in light output efficiency. Conversely, when the ratio between the height H and the bottom width W is smaller than 0.2, it is unable to improve the light output efficiency of the epitaxial structure subsequently formed on the patterned substrate 50.

On the other hand, a space S and a pitch P exist between any two adjacent patterns 52, and the space S may be smaller than or equal to 0.5 µm, and the pitch P may be greater than 500 nm and smaller than or equal to 2500 nm, such that the epitaxial structure 100 formed on the patterned substrate 50 has good light output efficiency. In the embodiment, the space S between any two adjacent patterns 52 may be selectively smaller than the bottom width W of the pattern 52. However, the disclosure is not limited thereto, and in other embodiments, the space S between any two adjacent patterns 52 may also be greater than the bottom width W of the pattern 52. It should be noted that in the embodiment, the quantity of the patterns 52 is, for example, ten, but the disclosure is not limited thereto, and in other embodiments, the quantity of the patterns 52 may also be more than eleven.

Further, the epitaxial structure 100 has a first surface 100$s$1 and a second surface 100$s$2 opposite to each other, and the epitaxial structure 100 is connected to the patterned substrate 50 through the first surface 100$s$1. In other words, the first surface 100$s$1 of the epitaxial structure 100 may be conformal to an upper surface 50$s$ of the patterned substrate 50, but the disclosure is not limited thereto. The epitaxial structure 100 further has a plurality of first dislocation density regions DR1 and a plurality of second dislocation density regions DR2, and the first dislocation density regions DR1 respectively correspond to the patterns 52. To be specific, the first dislocation density regions DR1 are respectively overlapped with the patterns 52 in a normal direction (i.e. the direction Z) of the substrate 51, and one second dislocation density region DR2 is configured between any two adjacent first dislocation density regions DR1. According to another aspect, the patterns 52 may substantially define the plurality of first dislocation density regions DR1 of the epitaxial structure 100, and the plurality of first dislocation density regions DR1 and the plurality of second dislocation density regions DR2 are disposed on the patterned substrate 50 in alternation along the direction X (as shown in FIG. 2).

On the other hand, a dislocation density of the first dislocation density region DR1 is lower than a dislocation density of the second dislocation density region DR2. For example, in the embodiment, a volume of a space occupied by the first dislocation density region DR1 is greater than a volume of a space occupied by the second dislocation density region DR2, and a quantity of threading dislocations TD located in the first dislocation density region DR1 is less than a quantity of threading dislocations TD located in the second dislocation density region DR2. However, the disclosure is not limited thereto, and in other embodiments, the volume of the space occupied by the first dislocation density region DR1 may also be smaller than the volume of the space occupied by the second dislocation density region DR2, or the quantity of the threading dislocations TD located in the first dislocation density region DR1 may be greater than the quantity of the threading dislocations TD located in the second dislocation density region DR2, as long as the dislocation density of the first dislocation density region DR1 is lower than the dislocation density of the second dislocation density region DR2. In an exemplary embodiment, a ratio between the dislocation density of any of the second dislocation density regions DR2 and the dislocation density of any of the first dislocation density regions DR1 may be greater than or equal to 10, so as to averagely disperse a stress in the epitaxial layer, improve the epitaxial quality in the subsequent manufacturing process and improve the light-emitting uniformity.

For example, in an embodiment, the dislocation density of the first dislocation density region DR1 of the gallium nitride epitaxial structure formed on the patterned substrate 50 with the substrate 51 made of sapphire is between $10^7$ ($cm^{-2}$) and $10^8$ ($cm^{-2}$), and the dislocation density of the second dislocation density region DR2 is greater than or equal to $10^9$ ($cm^{-2}$). It should be noted that the dislocation density of the first dislocation density region DR1 may also be a dislocation density average of a plurality of the first dislocation density regions DR1, and the dislocation density of the second dislocation density region DR2 may also be a dislocation density average of a plurality of the second dislocation density regions DR2, which is not limited by the disclosure.

It should be noted that the threading dislocation TD shown in the embodiment extends from the first surface 100$s$1 to the second surface 100$s$2 of the epitaxial structure 100, but the disclosure is not limited thereto. In other embodiments, a part of the threading dislocation TD only penetrates through the light-emitting layer 120 without extending to the second surface 100$a$2 of the epitaxial structure 100. On the other hand, in the embodiment, the quantity of the threading dislocations TD located in the second dislocation density region DR2 is, for example, one, but the disclosure is not limited thereto. In other embodiments, the quantities of the threading dislocations TD located in the first dislocation density region DR1 and the second dislocation density region DR2 may be respectively one or more and two or more, as long as the density of the threading dislocations TD located in the first dislocation density region DR1 is smaller than the density of the threading dislocations TD located in the second dislocation density region DR2.

It should be noted that in the embodiment, the quantity of the first dislocation density regions DR1 disposed on the epitaxial structure 100 in the direction X is, for example, ten, but the disclosure is not limited thereto. In other embodiments, the quantity of the first dislocation density regions DR1 disposed on the epitaxial structure 100 in the direction X may also be eleven or more. To be specific, the quantity of the first dislocation density regions DR1 (or the patterns 52 of the patterned substrate 50) disposed on the epitaxial structure 100 of the disclosure in any direction (for example, the direction X) that is perpendicular to the normal direction (i.e. the direction Z) of the substrate 51 is at least ten. In this way, the dislocation distribution of the epitaxial structure 100 is regular and even. Conversely, if the quantity of the first dislocation density regions DR1 (or the patterns 52 of the patterned substrate 50) is less than ten, the dislocations of the epitaxial structure 100 are easily gathered in a specific region, which result in a poor light output uniformity of the epitaxial structure 100.

Further, the epitaxial structure 100 further includes a first type semiconductor layer 110, a light-emitting layer 120 and a second type semiconductor layer 130, where the light-emitting layer 120 is clamped between the first type semiconductor layer 110 and the second type semiconductor layer 130, and the first type semiconductor layer 110 and the second type semiconductor layer 130 respectively have the first surface 100$s$1 and the second surface 100$s$2. On the other hand, the light-emitting device structure 1 further includes a first electrode 151 and a second electrode 152, and the first electrode 151 and the second electrode 152 are electrically connected to the first type semiconductor layer 110 and the second type semiconductor layer 130, respectively. Particularly, the epitaxial structure 100, the first electrode 151 and the second electrode 152 may construct a light-emitting device 10 (shown in FIG. 3). It should be noted that in other embodiments, a plurality of light-emitting devices 10 may be simultaneously formed on the patterned substrate as long as the quantity of the first dislocation density regions DR1 of each of the light-emitting devices 10 is at least ten, so as to improve the light output uniformity of each of the light-emitting devices 10.

In the embodiment, the first electrode 151 and the second electrode 152 are disposed at a same side of the epitaxial structure 100. To be specific, the light-emitting device 10 is, for example, a lateral type micro Light-Emitting Diode (micro LED) device, but the disclosure is not limited thereto. In other embodiments, the light-emitting device may also be a flip-chip type micro LED. The so-called "micro" LED refers to that the LED has a size of 1 µm to 100 µm. In some embodiments, the micro LED may have a maximum width of 20 µm, 10 µm or 5 µm. In some embodiments, the micro LED may have a maximum height smaller than 20 µm, 10 µm or 5 µm. It should be understood that the embodiment of the disclosure is not limited thereto, and the aspects of certain embodiments may be applied to larger and perhaps smaller scales.

Referring to FIG. 2, in the embodiment, the light-emitting layer 120 includes a plurality of well layers 121 and a plurality of barrier layers 122 stacked in alternation, where an energy gap of the barrier layer 122 is greater than an energy gap of the well layer 121. Namely, the light-emitting layer 120 of the embodiment is a multiple quantum wells structure. In the embodiment, a material of the barrier layer 122 is, for example, GaN, and a material of the well layer 121 is, for example, InGaN. Namely, a main difference between the well layers 121 and the barrier layers 122 is that the well layers 121 include extra doped metal DM (for example, indium atoms), and a molar percentage of gallium atoms thereof is different from a molar percentage of the gallium atoms of the barrier layers 122. However, the disclosure is not limited thereto, and in other embodiments, the well layers 121 and the barrier layers 122 may also be made of AlGaInP or other proper materials. It should be noted that the quantities of the well layers 121 and the barrier layers 122 of the embodiment are all, for example, two, but the disclosure is not limited thereto. In other embodiments, the quantities of the well layers 121 and the barrier layers 122 may be respectively three or more.

Since the dislocation density of the first dislocation density region DR1 is smaller than the dislocation density of the second dislocation density region DR2, a first thickness T1 of a first portion 120a of the light-emitting layer 120 (for example, the multiple quantum wells structure) in the first dislocation density regions DR1 is greater than a second thickness T2 of a second portion 120b of the light-emitting layer 120 in the second dislocation density regions DR2. Therefore, the doped metal DM (indium atoms) tends to be distributed in the first dislocation density region DR1 of the light-emitting layer 120 having a large thickness (i.e., the first portion 120a). For example, the first thickness T1 may be an average thickness of a plurality of the first portions 120a of the light-emitting layer 120 in a plurality of the first dislocation density regions DR1, and the second thickness T2 may be an average thickness of a plurality of the second portions 120b of the light-emitting layer 120 in a plurality of the second dislocation density regions DR2.

According to another aspect, the plurality of first portions 120a of the light-emitting layer 120 in the plurality of first dislocation density regions DR1 respectively have a first doped concentration, and the plurality of second portions 120b of the light-emitting layer 120 in the plurality of second dislocation density regions DR2 respectively have a second doped concentration, where the first doped concentration is higher than the second doped concentration. It should be noted that since the quantity of the first dislocation density regions DR1 (or the pattern 52 of the patterned substrate 50) disposed on the epitaxial structure 100 in the direction X is at least ten, the dislocation distribution of the epitaxial structure 100 is regular and even, and most of the doped metal DM may be evenly dispersed in the first dislocation density region DR1. In this way, the light output uniformity of the light-emitting device 10 is improved.

It should be noted that in the embodiment, the quantity of the epitaxial structures 100 (or the light-emitting devices) formed on the patterned substrate 50 is, for example, one, but the disclosure is not limited thereto. In other embodiments, two or more epitaxial structures 100 (or the light-emitting devices) may be formed on the patterned substrate as long as the quantity of the patterns 52 overlapped with each of the epitaxial structures 100 is at least ten. For example, in an embodiment, the quantity of the patterns 52 on the patterned substrate is more than $10^4$, and the patterns 52 are disposed on the substrate 51 in nano-scale spaces. Namely, at most $10^3$ epitaxial structures 100 may be fabricated on the patterned substrate, and each epitaxial structure 100 has a regular and uniform dislocation distribution due to having at least ten first dislocation density regions DR1, which avails reducing a light-emitting wavelength difference of the epitaxial structures 100. Namely, light-emitting wavelengths of the epitaxial structures 100 (or the light-emitting devices) fabricated by using the patterned substrate have better uniformity, which avails improving a color uniformity of the light-emitting device structure adopting the epitaxial structures 100.

Referring to FIG. 1 and FIG. 3, the light-emitting device 10 may also be removed from the patterned substrate 50 to become an independent member. In this case, the first surface 100s1 of the epitaxial structure 100 is configured with a plurality of patterns 111 separated from each other, and the patterns 111 and the epitaxial structure 100 are formed integrally. In the embodiment, the patterns 111 are recessed structures recessed into the first type semiconductor layer 110 from the first surface 100s1. It should be noted that the patterns 111 may correspond to the patterns 52 of the patterned substrate 50, and a roughness of the first surface 100s1 is greater than a roughness of the second surface 100s2. To be specific, the first surface 100s1 of the epitaxial structure 100 may be a rough surface, and the second surface 100s2 may be a flat surface. In this way, the light output efficiency and light output concentration of the light-emitting device 10 may be enhanced.

Figure 4B:
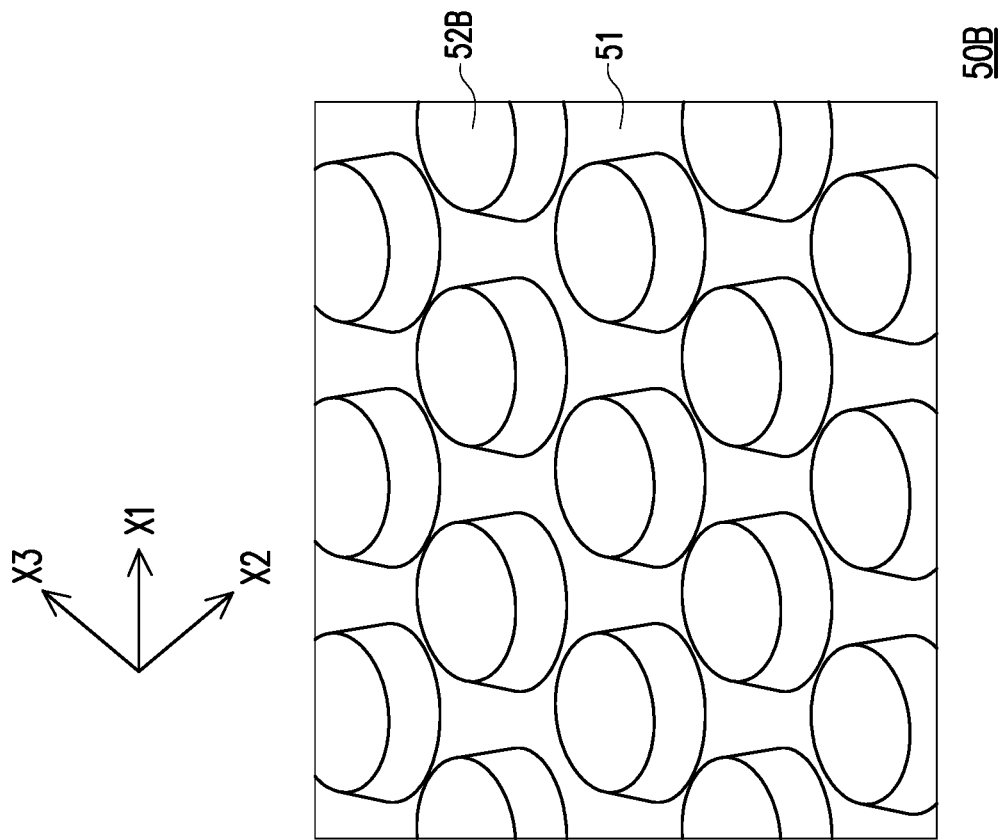
FIG. 4B is a three-dimensional view of a partial region of a patterned substrate according to still another embodiment of the disclosure.
Figure 4A:
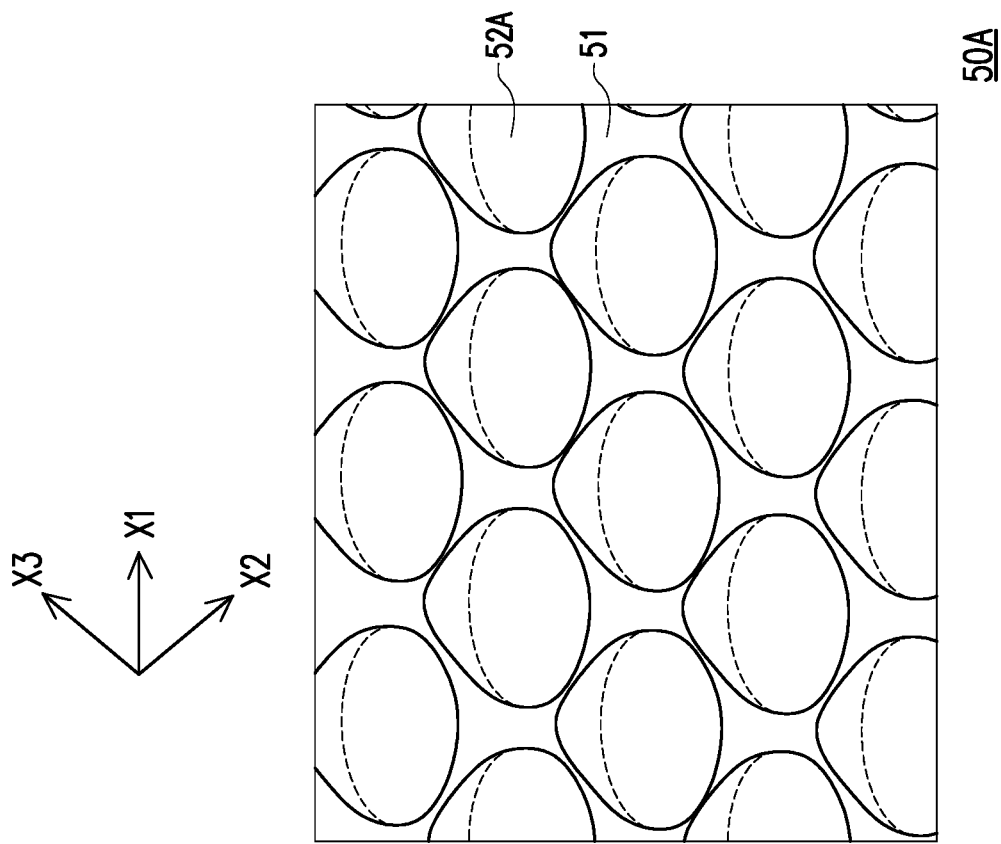
FIG. 4A is a three-dimensional view of a partial region of a patterned substrate according to another embodiment of the disclosure.

FIG. 4A is a three-dimensional view of a partial region of a patterned substrate according to another embodiment of the disclosure. FIG. 4B is a three-dimensional view of a partial region of a patterned substrate according to still another embodiment of the disclosure. Referring to FIG. 4A, a main difference between the patterned substrate 50A of the embodiment and the patterned substrate 50 of FIG. 1 lies in different configurations of the patterns. In the embodiment, outer contours of the patterns 52A are, for example, cones, and the configuration of the cones makes the epitaxial structure subsequently formed on the patterned substrate 50A to have better light output efficiency and a better light output pattern. However, the disclosure is not limited thereto, and in other embodiments, the outer contours of the patterns 52B of the patterned substrate 50B may also be cylinders (shown in FIG. 4B). In other embodiments that are not illustrated, the outer contours of the patterns may also be polygonal cylinders, polygonal cones, other proper configuration or a combination thereof, which is not limited by the disclosure.

In the embodiment, the patterns 52A are disposed on the substrate 51. To be specific, the patterns 52A are respectively disposed on the substrate 51 along a direction X1, a direction X2 and a direction X3 (i.e. the patterns 52A are distributed on the substrate 51 in a most dense arrangement). However, the disclosure is not limited thereto, and in other embodiments, the patterns 52A may also be disposed on the substrate 51 along two directions or four directions.

Figure 5:
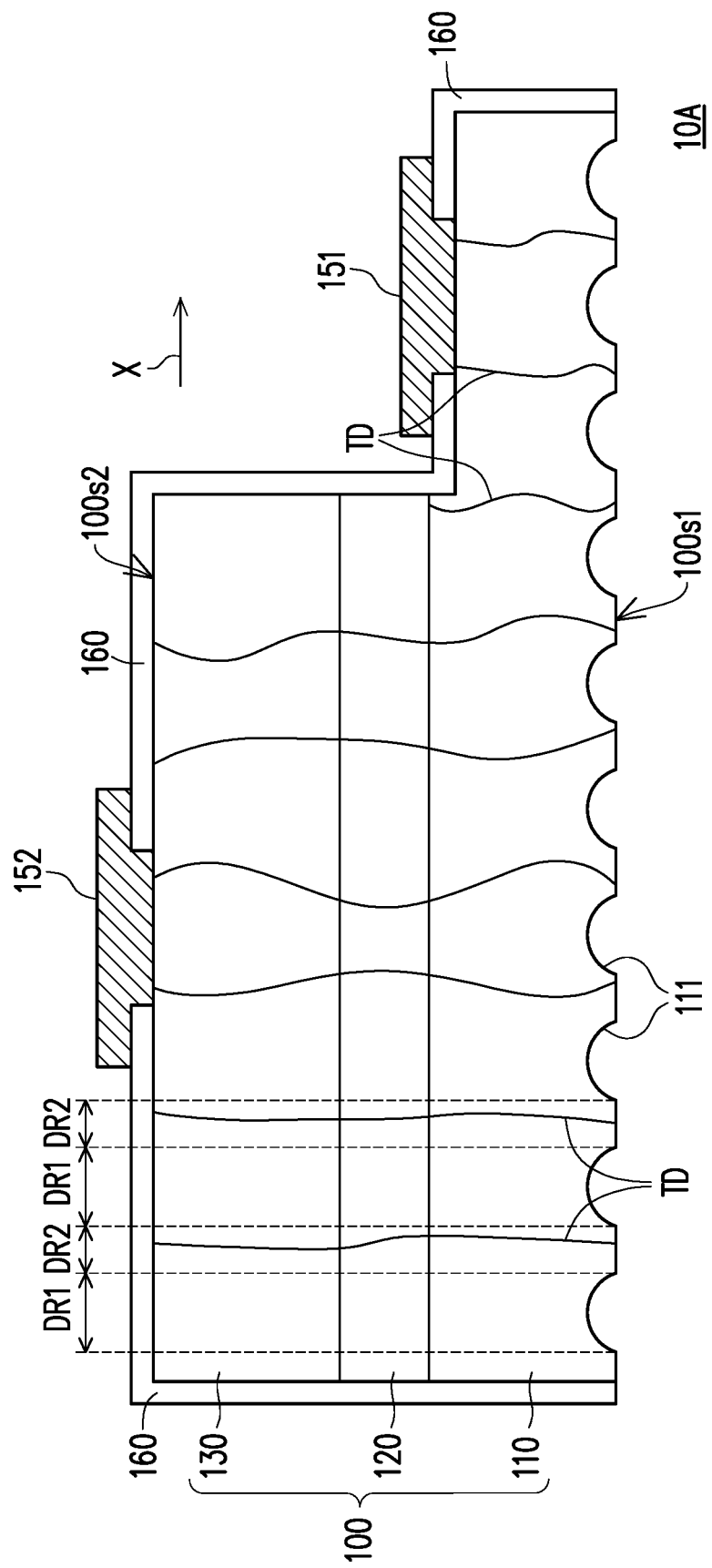
FIG. 5 is a cross-sectional view of a light-emitting device according to another embodiment of the disclosure.

FIG. 5 is a cross-sectional view of a light-emitting device according to another embodiment of the disclosure. Referring to FIG. 5, a difference between the light-emitting device 10A of the embodiment and the light-emitting device 10 of FIG. 3 lies in composition of the light-emitting device. In the embodiment, the light-emitting device 10 further includes an insulation layer 160. The insulation layer 160 covers a part of the surface of the epitaxial structure 100, and the first electrode 151 and the second electrode 152 penetrate through the insulation layer 160 to electrically connect the first type semiconductor layer 110 and the second type semiconductor layer 130, respectively.

Figure 6:
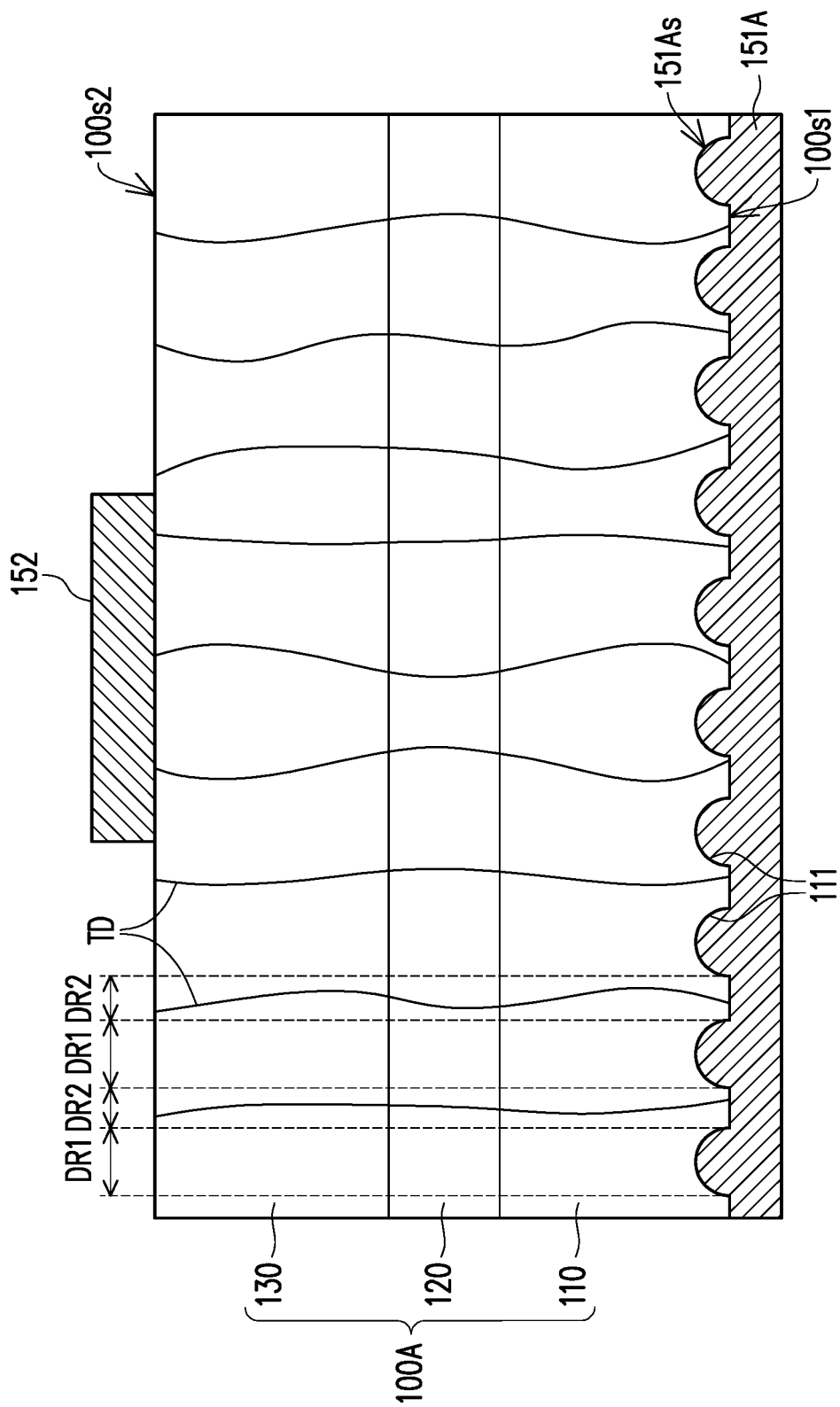
FIG. 6 is a cross-sectional view of a light-emitting device according to still another embodiment of the disclosure.

FIG. 6 is a cross-sectional view of a light-emitting device according to still another embodiment of the disclosure. Referring to FIG. 6, a difference between the light-emitting device 11 of the embodiment and the light-emitting device 10 of FIG. 3 lies in different configuration methods of the electrodes. In the embodiment, the first electrode 151A and the second electrode 152 of the light-emitting device 11 are configured at two opposite sides of the epitaxial structure 100A. To be specific, the light-emitting device 11 of the embodiment may be a vertical type micro LED device. In detail, the first electrode 151A is formed on the first surface $100s1$, and is filed in the plurality of patterns 111 of the epitaxial structure 100A, so as to electrically connect the first type semiconductor layer 110. To be specific, an upper surface 151As of the first electrode 151A is conformal to the first surface $100s1$ of the epitaxial structure 100A. Namely, a contact surface of the first electrode 151A and the first surface $100s1$ is a patterned surface.

Figure 7:
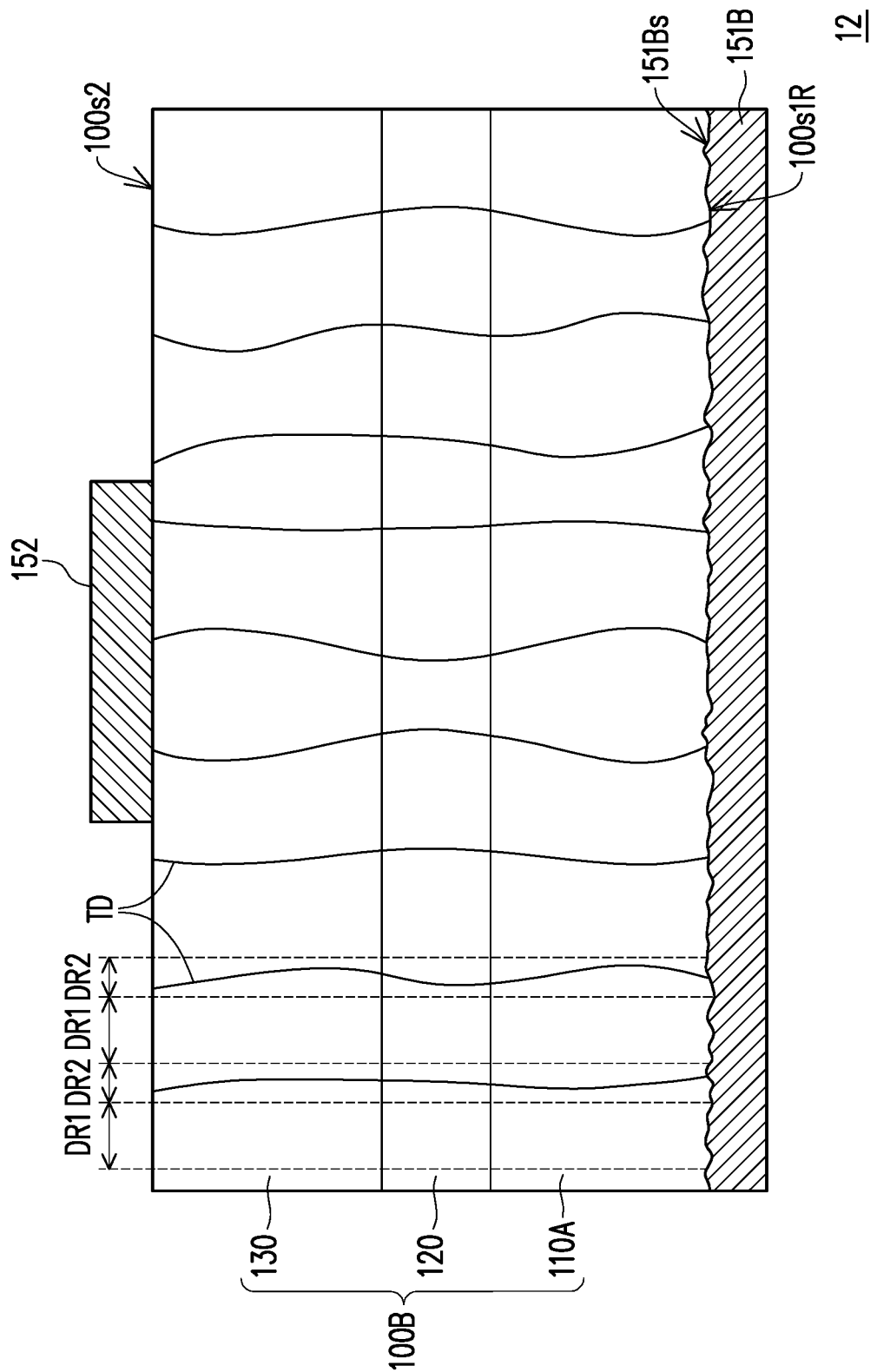
FIG. 7 is a cross-sectional view of a light-emitting device according to still another embodiment of the disclosure.

FIG. 7 is a cross-sectional view of a light-emitting device according to still another embodiment of the disclosure. Referring to FIG. 7, a difference between the light-emitting device 12 of the embodiment and the light-emitting device 11 of FIG. 6 lies in different surface configurations of the epitaxial structures. In the embodiment, the first surface $100s1R$ of the epitaxial structure 100B is not configured with the patterns 111 shown in FIG. 6, and a roughness of the first surface $100s1R$ is greater than a roughness of the second surface $100s2$. To be specific, the first surface $100s1R$ of the epitaxial structure 100B may be a rough surface, and the second surface $100s2$ may be a flat surface. In this way, the light output efficiency and light output concentration of the light-emitting device 12 may be enhanced.

For example, before the first electrode 151B of the light-emitting device 12 is formed, a grinding step may be performed to remove the patterns 111 (as shown in FIG. 6) recessed into the first type semiconductor layer 110. Then, the grinded surface is roughed to form the first surface $100s1R$ of the epitaxial structure 100B, and form the first electrode 151B on the first surface $100s1R$ to electrically connect the first type semiconductor layer 110A. As shown in FIG. 7, in the embodiment, the upper surface 151Bs of the first electrode 151B is conformal to the first surface $100s1R$ of the epitaxial structure 100B. It should be noted that a roughness of the surface is defined by an arithmetical mean roughness (Ra). However, the disclosure is not limited thereto, and the definition of the roughness may be adjusted to a root-mean-square roughness (Rq), a 10-point mean roughness (Rz) or other proper definitions according to a structural characteristic of the surface.

In summary, in epitaxial structure, the light-emitting device and the light-emitting device structure of an embodiment of the disclosure, the epitaxial structure has a plurality of first dislocation density regions and a plurality of second dislocation density regions disposed in alternation, and the dislocation density of the first dislocation density region is lower than the dislocation density of the second dislocation density region. By setting the quantity of the first dislocation density regions to be at least ten, the dislocation distribution of the epitaxial structure is regular and even, so as to improve light output uniformity of the light-emitting device and color uniformity of the light-emitting device structure.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A light-emitting device structure, comprising:
   a patterned substrate, comprising a substrate and a plurality of patterns, wherein the patterns and the substrate are formed integrally, and the patterns are separately disposed on the substrate from each other;
   an epitaxial structure, disposed on the patterned substrate, and having a plurality of first dislocation density regions and a plurality of second dislocation density regions, wherein the first dislocation density regions respectively correspond to the patterns, a dislocation density of each of the first dislocation density regions is lower than a dislocation density of each of the second dislocation density regions, and a quantity of the first dislocation density regions is at least ten; and
   a first electrode and a second electrode, wherein the epitaxial structure further comprises a light-emitting layer, a first type semiconductor layer and a second type semiconductor layer disposed at two opposite sides of the light-emitting layer, the first electrode and the second electrode are electrically connected to the first type semiconductor layer and the second type semiconductor layer, respectively, the light-emitting layer of the epitaxial structure comprises a plurality of first portions correspondingly located at the first dislocation density regions and a plurality of second portions correspondingly located at the second dislocation density regions, the first portions respectively have a first thickness, the second portions respectively have a second thickness, the first thickness is greater than the second thickness, the first portions respectively have a first doped concentration, the second portions respectively have a second doped concentration, and the first doped concentration is higher than the second doped concentration.

2. The light-emitting device structure as claimed in claim 1, wherein a ratio between the dislocation density of any second dislocation density region and the dislocation density of any first dislocation density region is greater than or equal to 10.

3. The light-emitting device structure as claimed in claim 1, wherein the patterns respectively have a bottom width and a height, and a ratio of the height and the bottom width is between 0.2 and 0.9.

4. The light-emitting device structure as claimed in claim 1, wherein a space exists between any two adjacent patterns, and the space is smaller than or equal to 0.5 µm.

5. The light-emitting device structure as claimed in claim 1, wherein each of the patterns is a protrusion structure.

6. The light-emitting device structure as claimed in claim 1, wherein a quantity of the first dislocation density regions disposed on the epitaxial structure in a direction is at least ten.

7. The light-emitting device structure as claimed in claim 6, wherein at least a part of the first dislocation density regions and at least a part of the second dislocation density regions are disposed on the patterned substrate in alternation along the direction.

8. The light-emitting device structure as claimed in claim 1, wherein a quantity of threading dislocations of the first dislocation density region is one or more, and a quantity of threading dislocations of the second dislocation density region is two or more.

9. The light-emitting device structure as claimed in claim 1, wherein a pitch exists between any two adjacent patterns, and the pitch is greater than 500 nm and smaller than or equal to 2500 nm.

* * * * *